US006917096B2

(12) United States Patent
Sugiyama et al.

(10) Patent No.: US 6,917,096 B2
(45) Date of Patent: Jul. 12, 2005

(54) SEMICONDUCTOR DEVICE AND METHOD OF MANUFACTURING SUBSTRATE

(75) Inventors: Naoharu Sugiyama, Yokohama (JP); Atsushi Kurobe, Yamato (JP); Tsutomu Tezuka, Yokohama (JP); Tomohisa Mizuno, Yokohama (JP); Shinichi Takagi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/611,157

(22) Filed: Jul. 2, 2003

(65) Prior Publication Data

US 2004/0070051 A1 Apr. 15, 2004

Related U.S. Application Data

(60) Division of application No. 09/935,685, filed on Aug. 24, 2001, now Pat. No. 6,607,948, which is a continuation-in-part of application No. 09/468,923, filed on Dec. 22, 1999, now Pat. No. 6,369,438.

(30) Foreign Application Priority Data

Dec. 24, 1998 (JP) ............................................ 10-367210
Aug. 25, 2000 (JP) ...................................... 2000-254958
Dec. 28, 2000 (JP) ...................................... 2000-402801

(51) Int. Cl.$^7$ ......................................... H01L 31/117
(52) U.S. Cl. ...................................................... 257/616
(58) Field of Search ................................. 257/613–616, 257/459; 438/291, 933, 752

(56) References Cited

U.S. PATENT DOCUMENTS

| | | | |
|---|---|---|---|
| 4,442,449 A | 4/1984 | Lehrer et al. ............... | 148/33.1 |
| 4,975,387 A | 12/1990 | Prokes et al. ............... | 438/486 |
| 5,019,882 A | * 5/1991 | Solomon et al. ............. | 257/409 |
| 5,218,213 A | 6/1993 | Gaul et al. ..................... | 257/55 |
| 5,521,108 A | 5/1996 | Rostoker et al. ............. | 438/504 |
| 5,759,898 A | 6/1998 | Ek et al. ....................... | 438/291 |
| 5,906,951 A | * 5/1999 | Chu et al. .................... | 438/751 |
| 6,059,895 A | 5/2000 | Chu et al. .................... | 148/33.1 |
| 6,228,692 B1 | 5/2001 | Tsutsu ......................... | 438/164 |
| 6,407,406 B1 | * 6/2002 | Tezuka ......................... | 257/18 |

OTHER PUBLICATIONS

Sugiyama e al., "Semiconductor Devices and Methods for Producing Semiconductor Devices", U.S. Appl. No. 09/658,191, filed Sep. 8, 2000.

Sugiyama et al., "Semiconducor Device and Method for Manufacturing the Same", U.S. Appl. No. 09/468,923, filed Dec. 22, 1999.

Mizuno et al., "Semiconductor Device and Method of Manufacturing the Same", U.S. Appl. No. 09/810,607, filed Mar. 19, 2001.

Y.H. Xie, et al., "Very High Molbility Two–Dimensional Hole Gas in Si/Ge$_x$Si$_{1-x}$/Ge Structures Grown by Molecular Beam Epitaxy", Appl. Phys. Lett. 63 (16), pp. 2263–2264, (1993).

(Continued)

*Primary Examiner*—Nathan J. Flynn
*Assistant Examiner*—Leonardo Andújar
(74) *Attorney, Agent, or Firm*—Finnegan, Henderson, Farabow, Garrett & Dunner, L.L.P.

(57) ABSTRACT

A semiconductor device comprises a base substrate, a silicon oxide layer formed on the base substrate, a first semiconductor layer formed on the silicon oxide layer, the first semiconductor layer including an SiGe layer with a Ge concentration not less than 30 atomic %, a second semiconductor layer formed on the first semiconductor layer, the second semiconductor layer including a Ge layer or an SiGe layer with a Ge concentration higher than the first semiconductor layer, a gate electrode configured to induce a channel in a surface region of the second semiconductor layer, and a gate insulating film formed between the second semiconductor layer and the gate electrode.

7 Claims, 8 Drawing Sheets

OTHER PUBLICATIONS

E. Murakami et al., "Fabrication of a Strain–Controlled SiGe/Ge MODFET with Ultrahigh Hole Mobility", IEEE Transactions on Electron Devices, vol. 41, No. 5, pp. 857–861, (1994).

Copending U.S.Appl. No. 09/955,144, Naoharu Sugiyama et al., "Semiconductor Device and Method of Producing the Same," filed Sep. 19, 2001.

\* cited by examiner

SEMICONDUCTOR DEVICE AND METHOD OF MANUFACTURING SUBSTRATE

CROSS-REFERENCE TO RELATED APPLICATIONS

This is a division of application Ser. No. 09/935,685, filed Aug. 24, 2001 now U.S. Pat. No. 6,607,948, which is a Continuation-in-Part (CIP) of application Ser. No. 09/468,923 filed Dec. 22, 1999, now U.S. Pat. No 6,369,438, issued Apr. 9, 2002, all of which are incorporated herein by reference.

This application is based upon and claims the benefit of priority from the prior Japanese Patent Applications No. 10-367210, filed Dec. 24, 1998; No. 2000-254958, filed Aug. 25, 2000; and No. 2000-402801, filed Dec. 28, 2000, the entire contents of all of which are incorporated herein by reference.

BACKGROUND OF THE INVENTION

1. Field of the Invention

The present invention relates to a semiconductor device and a method of manufacturing a substrate for forming such a semiconductor device thereon.

2. Description of the Related Art

It is known that strained germanium (Ge), silicon (Si) and SiGe show a mobility of electrons and holes higher than that of unstrained ordinary Si. Transistors using such strained Ge, Si or SiGe for the channel layer have been proposed.

Ge, Si or SiGe to be used for the channel layer is formed on an SiGe buffer layer laid on crystal silicon. The SiGe buffer layer is used to absorb the difference in the lattice constant between Si and Ge. To raise the mobility in the channel layer, it is important to increase the strain in the case of a strained Si channel layer. In the case of the SiGe channel layer, the mobility is effectively raised by increasing the composition ratio, or the concentration, of Ge. The Ge concentration in the SiGe buffer layer needs to be raised to a certain extent in order to increase the strain of the strained Si channel layer. The Ge concentration in the SiGe buffer layer also needs to be raised to a certain extent for increasing the strain of the SiGe channel layer.

However, the lattice constant of the underlying Si and that of the SiGe buffer layer show a large difference when the Ge composition ratio of the SiGe buffer layer is high. As a result, there arise problems including that it is no longer possible to provide a sufficiently relaxed SiGe buffer layer and that the dislocation density of the SiGe buffer layer increases. Then, a thick SiGe buffer layer may have to be formed to alleviate these problems.

Meanwhile, known techniques for forming an SiGe layer-include the following.

The first one is to epitaxially grow SiGe on an SOI (silicon on insulator) substrate [A. R. Powell et al., Appl. Phys. Lett. 64, 1856 (1994)]. However, this technique is accompanied by the problem that dislocations can occur in the SOI layer as a result of the annealing for relaxing the epitaxially grown SiGe.

With the second technique, an oxide film formed on an Si substrate and the SiGe epitaxially grown on the Si substrate are bonded together and subsequently the epitaxially grown SiGe is partly removed [Japanese Registered Patent Nos. 3037934 and 2908787]. With this technique, an about several micrometers thick SiGe buffer layer is formed on the Si substrate and then an SiGe thin film having a desired composition ratio is formed thereon. Then, as a result, undulations that are referred to as cross hatches are produced on the surface. Additionally, the buffer shows a high dislocation density in the inside, which increases as the Ge concentration rises.

The third technique is to form an SiGe layer on an oxide film by a SIMOX method using oxygen ion implantation and annealing. However, with this technique, Ge and oxygen are coupled together to evaporate in the annealing process so that it is no longer possible to form a buried oxide film continuously when the Ge concentration is raised.

On the other hand, Japanese Patent Application Laid-Open No. 2-196436 discloses a transistor formed by using strained Ge for the channel layer and having a structure produced by sequentially laying a p-SiGe buffer layer, an i-SiGe spacer layer, an i-Ge channel layer, an i-SiGe spacer layer, a p-SiGe layer, an i-SiGe layer (SiGe cap layer) and a Ti Schottky gate electrode on an n type Si substrate.

With the above described transistor structure, the SiGe buffer layer is directly formed on the Si substrate, the SiGe spacer layer is formed on the SiGe buffer layer and the Ge channel layer is formed thereon. Accordingly, the SiGe buffer layer needs to have a large film thickness in order to absorb the difference in the lattice constant between Si and Ge. Additionally, the above structure is also accompanied by the problem of an increased leak current because defects such as dislocations are formed in the SiGe buffer layer and the problem that the leak current directly flows to the Si substrate because no insulating layer is interposed between the Si substrate and the SiGe buffer layer.

It should be noted here that E. Murakami et al., IEEE Transaction on Electron Devices, Vol. 41, p. 857 (1994) and Y. H. Xie et al., Applied Physics Letters Vol. 63, p. 2263 (1994) disclose similar structures.

In short, by any of the above described known methods of manufacturing a substrate, it is difficult to provide a thin SiGe buffer layer that shows a high Ge concentration and few defects such as dislocations and is sufficiently relaxed.

Additionally, known semiconductor devices of the type under consideration show a large leak current and hence cannot provide satisfactory characteristics and a sufficient level of reliability because it is difficult to obtain a high quality SiGe buffer layer.

BRIEF SUMMARY OF THE INVENTION

In the first aspect of the invention, there is provided a semiconductor device comprising: a base substrate; a silicon oxide layer formed on the base substrate; a first semiconductor layer formed on the silicon oxide layer, the first semiconductor layer including an SiGe layer with a Ge concentration not less than 30 atomic %; a second semiconductor layer formed on the first semiconductor layer, the second semiconductor layer including a Ge layer or an SiGe layer with a Ge concentration higher than the first semiconductor layer; a gate electrode configured to induce a channel in a surface region of the second semiconductor layer; and a gate insulating film formed between the second semiconductor layer and the gate electrode.

In the second aspect of the invention, there is provided a method of manufacturing a substrate comprising: forming a laminated layer including a layer containing silicon and oxygen and an SiGe layer, the layer containing silicon and oxygen being located between the base substrate and the SiGe layer; and oxidizing the SiGe layer to form a silicon oxide layer and to increase a Ge concentration of the SiGe layer.

DETAILED DESCRIPTION OF THE INVENTION

Now, embodiments of the present invention will be described in greater detail by referring to the accompanying drawings.

(1st Embodiment)

Figure 1:
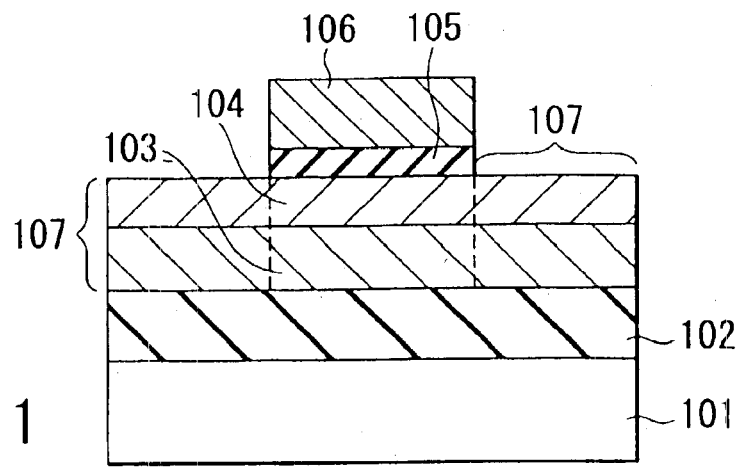
FIG. 1 is a schematic cross sectional view showing a basic structure of a semiconductor device according to the first embodiment of the invention.

FIG. 1 is a schematic cross sectional view of a MOSFET (MISFET) of the first embodiment.

A silicon oxide film 102 is formed on a semiconductor substrate (single crystal Si substrate) 101 as insulating film and a single crystal SiGe buffer layer 103 is formed on the silicon oxide film 102. The SiGe buffer layer 103 shows a Ge composition ratio, or a Ge concentration, not less than 30 atomic % and is expressed by formula $Si_{1-x}Ge_x(1>x\geq0.3)$. A channel layer 104 made of a single crystal SiGe layer showing a Ge composition ratio higher than the SiGe buffer layer 103 is formed on the buffer layer 103. The channel layer 104 may alternatively be made of a Ge layer. A gate insulating film 105 is formed on the channel layer 104 and a gate electrode 106 is formed on the gate insulating film 105. A pair of source/drain regions 107 are formed in the SiGe buffer layer 103 and the channel layer 104 with the gate electrode 106 disposed between them. The pair of source/drain regions 107 are connected respectively to a source electrode and a drain electrode (not shown).

In the MISFET of this embodiment, strain is introduced into the channel layer 104 due to the difference in the lattice constant between the SiGe buffer layer 103 and the channel layer 104. Additionally, it is possible to make the SiGe buffer layer 103 show a high Ge concentration, few defects including dislocations, a sufficiently high degree of relaxation and a thin film thickness by means of a technique as will be described hereinafter. Since the SiGe buffer layer 103 has a high quality with a high Ge concentration, an SiGe layer showing a higher Ge concentration (or a Ge layer) can be used for the channel layer 104. As a result, it is possible to provide a high speed MISFET showing a mobility of holes and electrons in the channel layer far exceeding that of Si channel. It should be noted here that the mobility of the channel layer 104 can be raised relative to that of Si even if no strain is introduced into the channel layer. However, the mobility can be increased when strain is introduced into the channel layer than when no strain is introduced there.

Thus, the MISFET of this embodiment comprises a SiGe buffer layer 103 and a channel layer 104 formed on a silicon oxide film 102 and a pair of source/drain regions 107 are formed in the SiGe buffer layer 103 and the channel layer 104. Then, any leak current trying to flow to the Si substrate 101 is blocked by the silicon oxide film 102. Additionally, as will be described hereinafter, both the SiGe buffer layer 103 and the channel layer 104 can be made thin. Therefore, the area of the pn junction of the source/drain regions 107 can be reduced. Additionally, both the channel layer 104 and the SiGe buffer layer 103 are depleted when the gate voltage is applied. As a result, the leak current between the source and the drain can be remarkably reduced.

Thus, the MISFET of this embodiment can operate at high speed with little leak current to provide satisfactory characteristics and a sufficient level of reliability.

Preferably, the dislocation density of the SiGe buffer layer 103 of this embodiment is not higher than $10^6$ cm$^{-2}$. Then, the yield of devices or LSIs can be held to a practically feasible level. More preferably, the dislocation density is not higher than $10^4$ cm$^{-2}$.

Preferably, the Ge contained in the SiGe buffer layer 103 shows a uniform distribution in the depth direction. Then, no strain is accumulated in the SiGe buffer layer so that dislocation hardly occurs.

Preferably, a single crystal Si cap layer is formed between the channel layer 104 and the gate insulating film 105. The Si cap layer can prevent oxidation of the Ge surface during the manufacturing process. Additionally, the Si cap layer can reduce the interface states of the gate insulating film 105. Still additionally, no dislocations occur when the Si cap layer has a thickness less than the critical film thickness (the lower limit of film thickness for producing dislocations due to lattice mismatching) for the SiGe. For the above reasons, a high carrier mobility can be achieved by providing an Si cap layer.

The above described SiGe buffer layer shows a high Ge composition ratio (not less than 30 atomic %). A manufacturing method as described below will be used for manufacturing a substrate having such an SiGe layer.

Firstly, a base substrate is brought in. A single crystal silicon substrate is typically used for the base substrate. Then, a laminated layer including a layer containing silicon and oxygen and an SiGe layer (preferably a relaxed single crystal SiGe layer) is formed on the base substrate. Thereafter, the layers are heat-treated in an oxidizing atmosphere. As a result of the heat-treatment (oxidizing treatment), both the layer containing silicon and oxygen and the SiGe layer are oxidized to produce a silicon oxide film.

At this time, the film thickness of the SiGe layer is decreased and the Ge concentration of the SiGe layer is raised.

The layer containing silicon and oxygen has been formed before the oxidation because the layer triggers the growth of the silicon oxide film. The silicon oxide film formed on the SiGe layer as a result of the oxidizing treatment may be removed if necessary.

The Ge concentration of the SiGe layer is raised by the oxidizing treatment probably for the following reason. The Si—O bond of $SiO_2$ is chemically more stable than the Ge—O bond of $GeO_2$ or that of GeO. Therefore, it may be safe to presume that oxygen atoms are preferentially bonded to Si atoms to consequently raise the Ge concentration of the SiGe layer.

Roughly speaking, if Ge is diffused in the SiGe layer or accumulated on the interface of the SiGe layer depends on the dimensional relationship between the diffusion length of Ge per unit time and the thickness by which SiGe is consumed by oxidation per unit time (consumption rate). If the diffusion length is greater than the consumption rate, Ge will be diffused in the SiGe layer to show a uniform Ge concentration in the depth direction. If, on the other hand, the consumption rate is greater than the diffusion length, Ge will be accumulated on the interface.

Figure 2A:
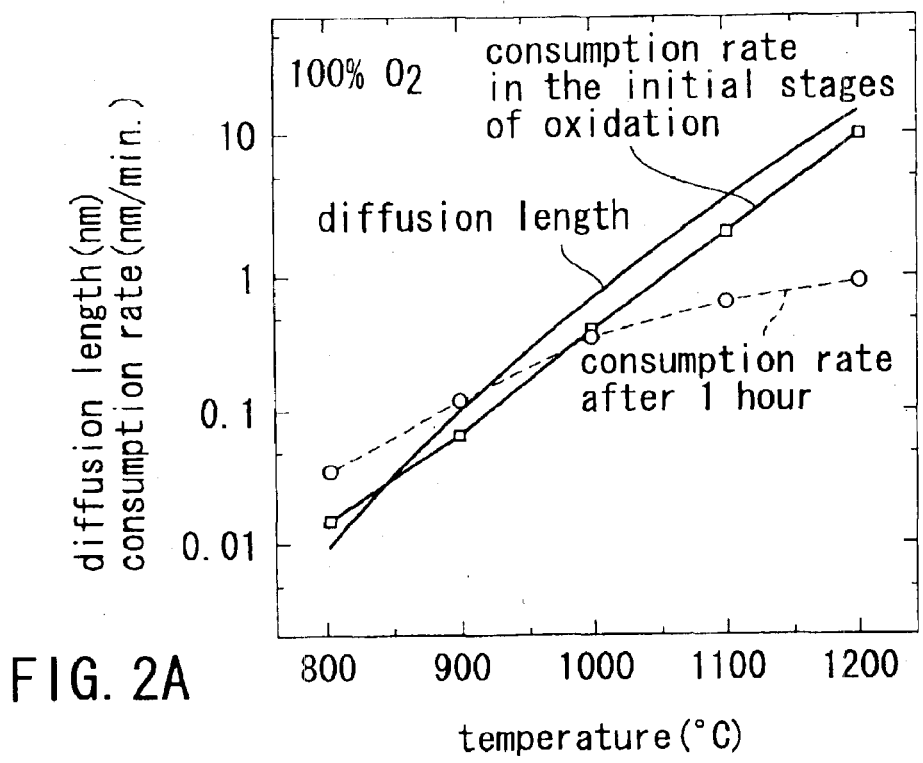
FIGS. 2A and 2B are graphs showing the relationship between the diffusion length of Ge atoms in Si and the consumption rate of SiGe due to oxidation according to the first embodiment of the invention.
Figure 2B:
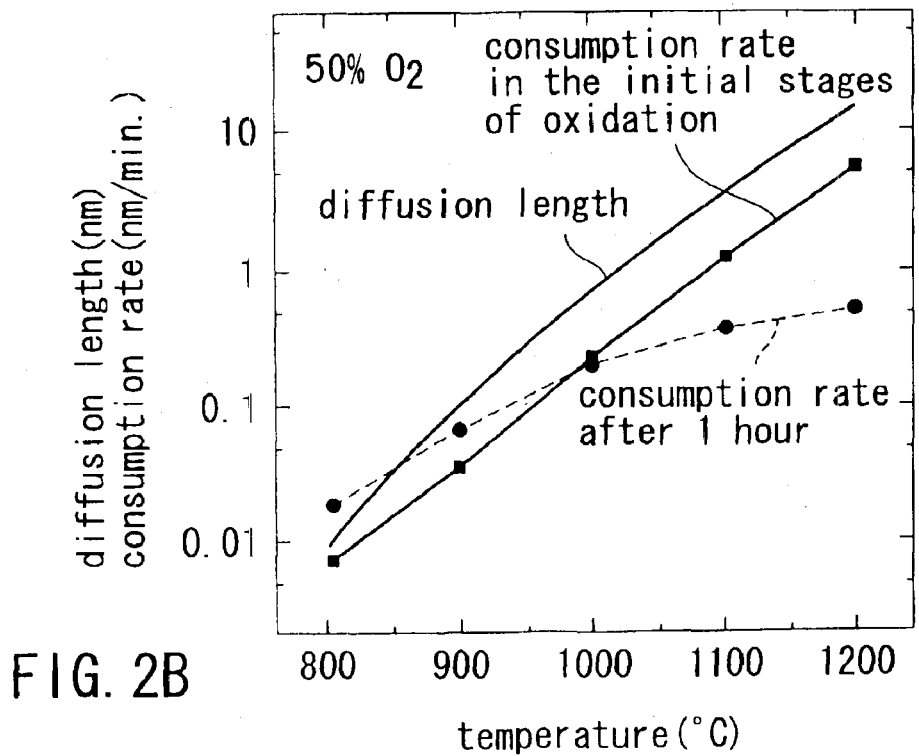

FIGS. 2A and 2B are graphs showing the relationship between the diffusion length of Ge atoms in Si and the consumption rate of SiGe. As shown in FIG. 2A, if the atmosphere contains $O_2$ by 100%, the diffusion length always goes above the consumption rate when the oxidation temperature is not lower than 950° C.

However, since the consumption rate is substantially equal to the diffusion length immediately after the oxidation even above 950° C., Ge will be accumulated on the interface to a certain extent immediately after the oxidation. While no problem may arise if the film thickness of the accumulated area is sufficiently smaller than the critical film thickness, dislocations will occur when the former is substantially equal to or greater than the latter. The appearance of dislocations immediately after the oxidation can be suppressed by reducing the consumption rate without changing the temperature (means without changing the diffusion length). Preferably, oxygen gas diluted by inert gas is used for the atmosphere to do this. The consumption rate is substantially proportional to the partial pressure of oxygen. Therefore, the consumption rate will be substantially halved when oxygen gas diluted to 50% is used for the atmosphere to provide a wide margin relative to the diffusion length as shown in FIG. 2B. Thus, preferably, oxygen gas diluted to less than 50% is used for the atmosphere.

With the above described manufacturing method, since the Si oxide film becomes to look like viscous fluid, the slippage at the interface between the SiGe layer and the Si oxide film will be improved. As a result, the lattice constant rises easily as the Ge concentration of the SiGe layer is increased.

Thus, with the above described manufacturing method, it is possible to provide a thin SiGe buffer layer that shows a high Ge concentration and few defects such as dislocations and is sufficiently relaxed. Additionally, the surface coarseness of the SiGe buffer layer will be reduced. Then, the channel layer formed on obtained SiGe buffer layer shows a low dislocation density. Therefore, it is possible to provide a MISFET showing a high carrier mobility and a small leak current.

Now the first example of the embodiment will be described in greater detail.

Figure 3:
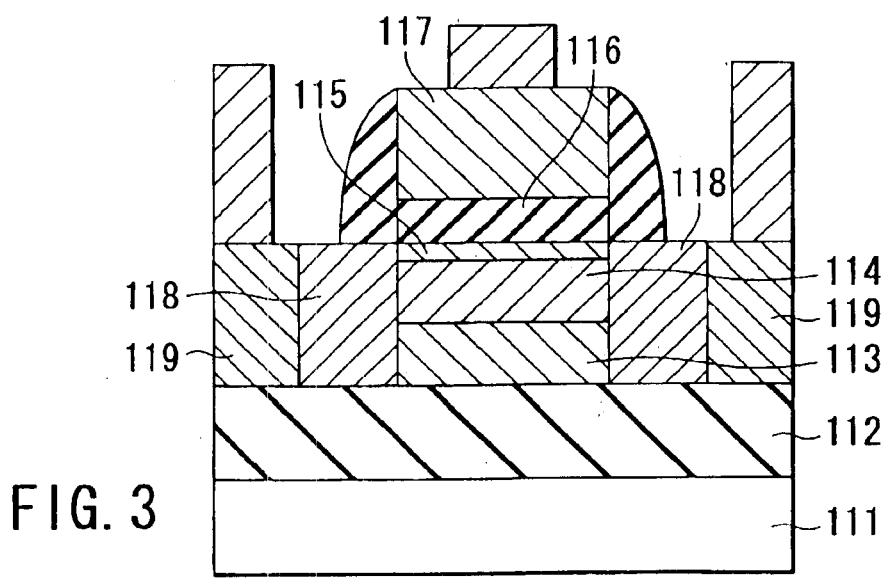
FIG. 3 is a schematic cross sectional view showing a structure of a semiconductor device according to the first embodiment of the invention.

FIG. 3 is a cross sectional view of a MISFET. Referring to FIG. 3, a buried silicon oxide film 112 is formed on a single crystal silicon substrate 111 having a crystal surface with the (100) orientation. A relaxed single crystal SiGe buffer layer 113 is formed on the silicon oxide film 112 and then a channel layer 114 made of strained single crystal Ge is formed thereon. An Si cap layer 115 is formed on the channel layer 114. A gate insulating film 116 is formed on the Si cap layer 115 and a gate electrode 117 is formed thereon. A pair of source/drain regions 118 are formed in the SiGe buffer layer 113 and the channel layer 114 with the gate electrode 117 disposed between them. Metal reaction layers 119 are formed outside the respective source/drain regions 118. A single crystal substrate with the (111) orientation or the (110) orientation may alternatively be used for the Si substrate 111.

Preferably, the channel layer 114 has a thickness not smaller than 3 nm in order to mostly confine carriers in the channel layer 114. Since the channel formed under the gate insulating film 116 shows a depth of about 5 nm, the channel layer 114 preferably has a thickness not smaller than 3 nm when the thickness of the Si cap layer 115 is taken into consideration.

The upper limit of the thickness of the channel layer 114 depends on the Ge composition ratio of the SiGe buffer layer 113. For example, when the Ge concentration of the SiGe buffer layer is 70 atomic %, the upper limit of the thickness of the channel layer 114 is 5 nm.

Theoretically, any desired value may be selected for the thickness of the SiGe buffer layer 113. However, preferably, the added thickness of the channel layer 114 and the SiGe buffer layer 113 is not more than 35 nm in the channel region in order to suppress the short channel effect when preparing a MISFET with a gate length not greater than 100 nm.

The Ge composition ratio of the SiGe buffer layer 113 is not less than 30 atomic %. When the Ge composition ratio is less than 30 atomic %, the strain of the channel layer 114 will be large to make it no longer possible to provide a flat film if the thickness of the channel layer 114 is not less than 3 nm.

Preferably, the Ge composition ratio of the SiGe buffer layer 113 is not less than 60 atomic %. When the Ge composition ratio is less than 60 atomic %, dislocations can occur in the channel layer 114 if the thickness of the channel layer 114 is not less than 3 nm. This is because the thermodynamic critical film thickness of Ge is 3 nm when the Ge composition ratio of the SiGe buffer layer 113 is 60 atomic %.

More preferably, the Ge composition ratio is not less than 60 atomic % and not more than 80 atomic %. The upper limit of 80 atomic % is provided to enjoy the effect of an increased hole mobility due to strain. The phonon scattering mobility of holes is more than double that of unstrained Ge due to the influence of strain applied to the channel layer 114 when the Ge composition is not less than 80 atomic %.

The channel layer 114 shows a Ge composition ratio higher than the SiGe buffer layer 113. Additionally, higher the Ge composition ratio of the channel layer 114, higher the carrier mobility. Therefore, from the viewpoint of carrier mobility, a Ge layer rather than an SiGe layer is preferably used for the channel layer.

Preferably, a very thin Si cap layer 115 is arranged between the channel layer 114 and the gate insulating film 116 in order to protect the surface of the channel layer 114. The Si cap layer 115 on the channel layer 114 protects the Ge surface from being oxidized in the process of manufacturing the transistor. Additionally, the upper surface of the gate insulating film 116 does not come into contact with the channel layer 114 (an SiGe layer or a Ge layer) when the Si cap layer 115 is formed so that any rise in the interface state can be prevented. Preferably, the Si cap layer 115 has a thickness not more than 2 nm in order to avoid any dislocations. This is because the thermodynamic critical film thickness of the Si cap layer is 2 nm when the Ge composition ratio of the SiGe buffer layer 113 is 80 atomic %. While it is desirable that the Si cap layer 115 has a small film thickness, it is not less than 0.5 nm from the viewpoint of fluctuations in the film thickness.

The embodiment may structurally devoid of the Si cap layer 115. Then, a germanium nitride film may be used for the gate insulating film 116 in place of any of the materials listed hereinafter. While a germanium nitride film may be obtained by CVD, it may alternatively be obtained by directly nitriding the Ge surface by ammonia gas or nitrogen gas.

The gate insulating film 116 may be made of silicon oxide film ($SiO_2$ film), silicon nitride film ($Si_3N_4$ film) or silicon oxynitride film ($SiO_xN_y$ film). Alternatively, it may be made of high dielectric constant film of a material selected from $Al_2O_3$, $Ta_2O_5$, $TiO_2$ and $Ya_2O_3$.

Figure 4:
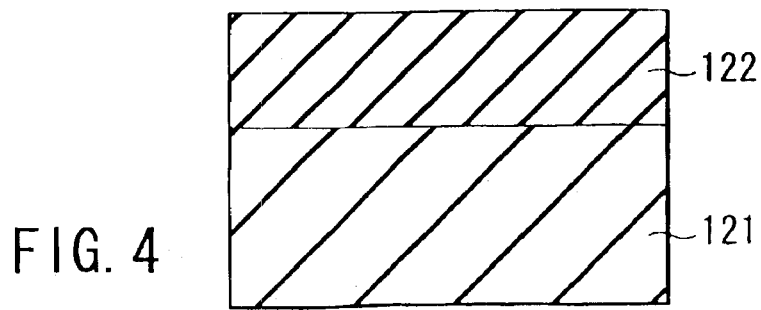
FIG. 4 is a schematic cross sectional view of a gate insulating film of the semiconductor device shown in FIG. 3.

Still alternatively, the gate insulating film 116 may be made of a laminated film of Zr silicate/$ZrO_2$ as shown in FIG. 4. In FIG. 4, a $ZrO_2$ layer 122 is formed on a Zr silicate layer 121. Silicate here refers to a substance where metal such as Zr, Hf or La is dissolved into $SiO_2$.

When the gate length is not greater than 100 nm, the source/drain regions 118 preferably has a thickness not more than 35 nm. Then, it is preferable to form silicide or germanide close to the lower ends of the gate side wall in order to suppress any possible increase in the parasitic resistance caused by the fact that the source/drain regions are thin. The metal contained in the silicide and germanide may be selected from Co, Ti and Ni.

The gate electrode 117 may be made of polycrystalline Si or polycrystalline SiGe that is doped with a p-type or n-type impurity. Alternatively, it may be made of metal such as W.

Now, the method of manufacturing a MISFET will be described by referring to FIGS. 5A through 5E.

Figure 5A:
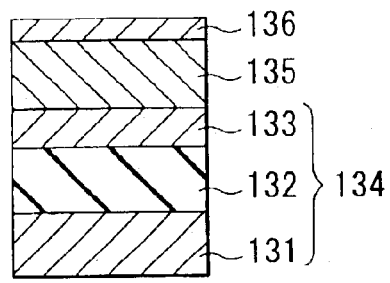
FIGS. 5A through 5E are schematic cross sectional views showing a manufacturing method of a semiconductor device according to the first embodiment of the invention.

Firstly, as shown in FIG. 5A, an SOI substrate 134 having an Si layer 131, a buried oxide film 132 and a (20 nm thick) SOI film 133 is brought in. Then, a (56 nm thick) $Si_{0.9}Ge_{0.1}$ layer 135 and a (5 nm thick) Si layer 136 are epitaxially grown on the SOI substrate 134 by UHV-CVD, MBE or LP-CVD method. At this time, no dislocations occur when the film thickness of each of the film layers is made lower than the critical film thickness of that film at the epitaxial growth temperature. Alternatively, a substrate having a silicon oxide film formed on an Si substrate or a substrate having a silicon oxide film and a SiGe layer sequentially formed on an Si substrate may be used.

Figure 5D:
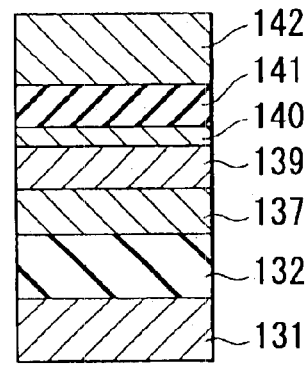
Figure 5B:
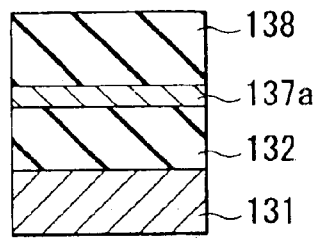

Then, referring to FIG. 5B, the SOI substrate is heated and oxidized in an oxidation furnace. As a result of this oxidation process, an SiGe layer ($Si_{0.3}Ge_{0.7}$ layer) 137a showing a Ge composition ratio higher than the $Si_{0.9}Ge_{0.1}$ layer 135 and a silicon oxide film 138 are formed. The oxidation process is conducted for 16 hours at 1,000° C., using oxygen gas diluted to 50% by nitrogen, until the SiGe layer 137a shows a film thickness of 8 nm. Alternatively, it may be conducted for 3 hours at 1,000° C., using oxygen gas diluted to 50% by nitrogen, and subsequently for 8 hours and 20 minutes, using 100% oxygen gas. Still alternatively, it may be conducted for 1 hour and 23 minutes at 1,050° C., using oxygen gas diluted to 50% by nitrogen, and subsequently for 8 hours and 20 minutes at reduced temperature of 1,000° C., using 100% oxygen gas. As a result of oxidation, the Ge composition ratio of the SiGe layer 137a becomes to be equal to 70 atomic %.

Care should be taken so that the oxidation temperature may not exceed the melting point of the SiGe layer 137a. In order to produce a SiGe layer 137a showing a Ge composition ratio of 70 atomic %, the final oxidation temperature should be held to lower than 1,025° C. The duration of the oxidation process can be effectively reduced by selecting a relatively high oxidation temperature not exceeding the melting point of the SiGe layer 137a that varies as a function of the Ge composition ratio in the initial stages and lowering the temperature gradually or stepwise.

Figure 5E:
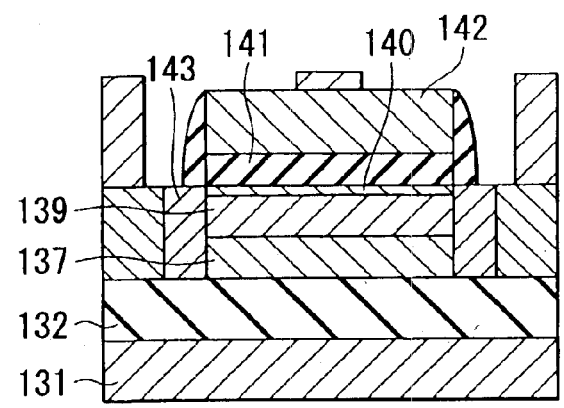
Figure 5C:
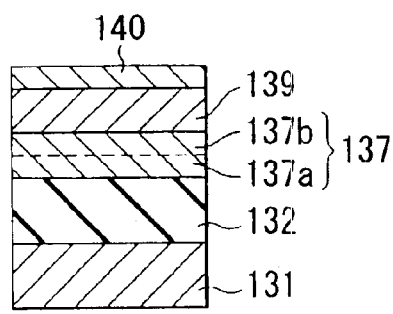

Then, referring to FIG. 5C, after removing the silicon oxide film 138, the surface is cleansed. Subsequently, a 5 nm thick SiGe buffer layer ($Si_{0.3}Ge_{0.7}$ layer) 137b and a 5 nm thick Ge channel layer 139 are sequentially formed also by UHV-CVD, MBE or LP-CVD.

Thereafter, an amorphous Si layer is deposited on the Ge channel layer 139 as Si cap layer 140. For depositing amorphous Si, material Si (Si, silane gas or disilane gas) is supplied after lowering the substrate temperature to less than 300° C. By depositing amorphous Si on the Ge channel layer 139 as Si cap layer 140, the problem of forming surface undulations and/or islands due to lattice mismatching is suppressed to produce a flat surface. While the amorphous Si layer is crystallized in a subsequent step, the surface flatness is maintained because the surface of the Si layer is covered by an oxide film so that the carrier mobility can be held to a high level. To the contrary, it is not desirable to epitaxially grow Si directly on the Ge channel layer 139 because undulations and/or islands may be formed due to lattice mismatching.

Then, as shown in FIG. 5D, an about 0.5 nm thick Si oxide film (not shown) is formed on the surface of the amorphous Si layer 140 by using a mixture solution of hydrochloric acid and hydrogen peroxide. Thereafter, a $ZrO_2$ film 141 is deposited as gate insulating film, by using laser abrasion or sputtering. Subsequently, a gate electrode 142 of poly SiGe is formed. At this time, the amorphous Si layer 140 is crystallized because the substrate temperature is raised to above 500° C.

Thereafter, as shown in FIG. 5E, source/drain regions 143 and other layers are formed to produce a transistor that looks and operates like one produced by an ordinary MOSFET process.

The structure shown in FIG. 5B can alternatively be formed by a process as described below.

Firstly, a 1 $\mu$m thick $Si_{1-x}Ge_x$ (x=0 through 0.1) layer having a sloping composition, a 1.5 $\mu$m thick $Si_{0.9}Ge_{0.1}$ layer and a 20 nm thick Si layer are sequentially formed on an Si substrate by UHV-CVD, MBE or LP-CVD.

Then, oxygen ions are implanted into the SiGe layer (with a Ge composition ratio of 10 atomic %) to a doze of $4 \times 10^{17}/cm^2$ by applying an acceleration voltage of 160 keV. Subsequently, a thermal oxide film is formed on the surface to a thickness not less than 10 nm in a heat-treatment process conducted at 900° C. The Ge composition ratio of the SiGe layer is made as low as 10 atomic % in order to produce a continuous and uniform buried oxide film. It is not possible to produce a continuous and uniform buried oxide film by means of this process when the Ge composition ratio is not less than 30 atomic % [Y. Ishikawa et al., Appl. Phys. Lett., 75, 983 (1999)].

A buried oxide film is formed in a region to a depth of 300 nm from the interface of the oxide film and the SiGe layer when annealed at 1,300° C. for 4 hours in an argon gas atmosphere containing oxygen to a slight extent (0.5%). The buried oxide film is made of substantially pure $SiO_2$ as Ge has been excluded therefrom. Thereafter, the SiGe layer is etched by means of a mixture solution of hydrofluoric acid and nitric acid until the layer shows a thickness of 56 nm.

Then, the Ge composition ratio of the SiGe layer is raised to 70 atomic % as it is oxidized in an oxygen atmosphere until it comes to show a thickness of 8 nm and a structure as shown in FIG. 5B is obtained.

Figure 6:
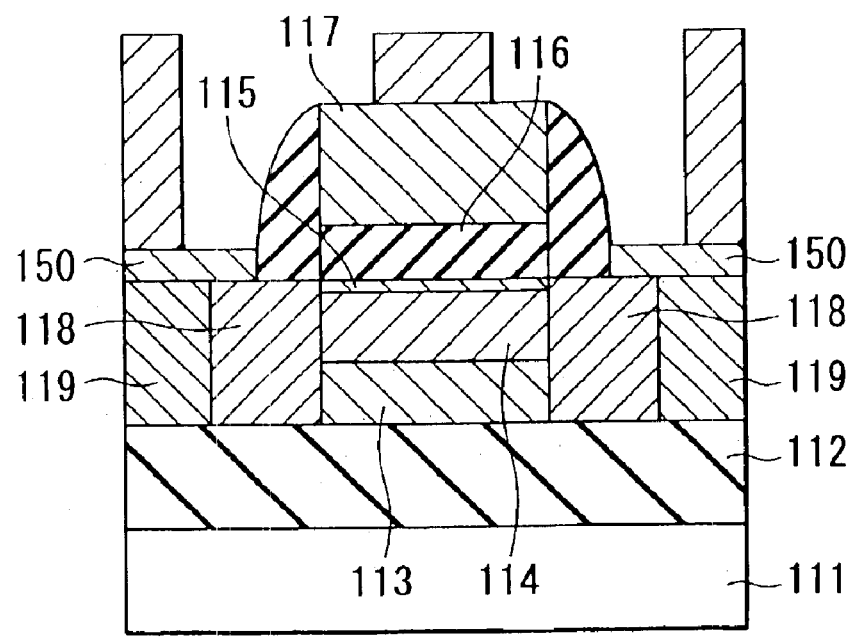
FIG. 6 is a schematic cross sectional view showing another structure of a semiconductor device according to the first embodiment of the invention.

Now, the second example of the first embodiment will be described by referring to FIG. 6. The device has a basic structure similar to that of FIG. 3.

In a MISFET, the surfaces of the source/drain regions 118 are covered by a thin film 150 of Al or W formed by a selective CVD method in order to suppress any possible increase in the parasitic resistance due to the small thickness of the source/drain regions.

Figure 7:
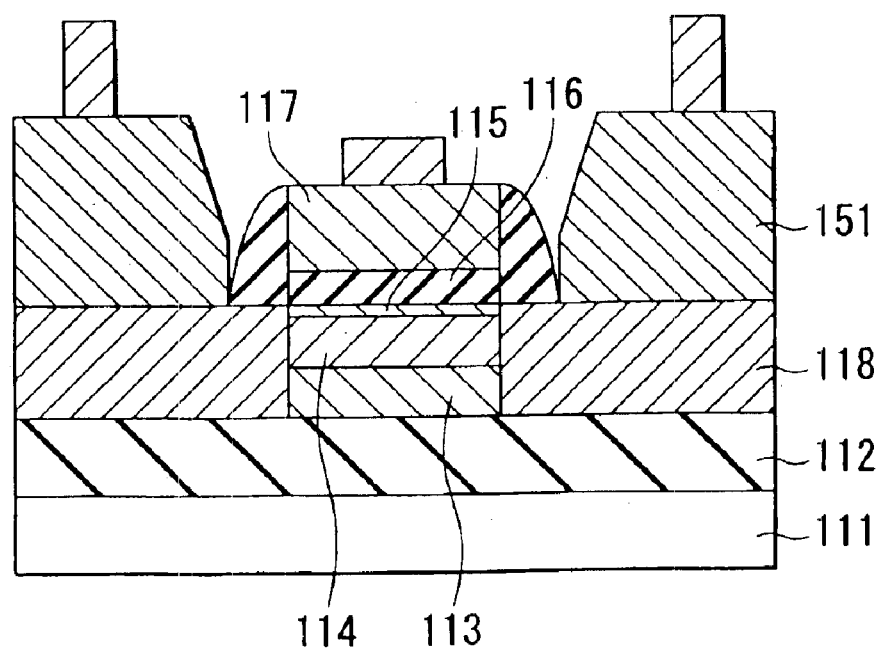
FIG. 7 is a schematic cross sectional view showing another structure of a semiconductor device according to the first embodiment of the invention.

The third example of the embodiment will be described by referring to FIG. 7. This device has a basic structure similar to that of FIG. 3.

In a MISFET, an $Si_{0.3}Ge_{0.7}$ layer 151 is formed selectively on the source/drain regions 118 and the thickness of the source/drain regions is raised to about 100 nm in order to suppress any possible increase in the parasitic resistance. This structure can be obtained by forming an $SiO_2$ mask on the entire surface, exposing only the upper surfaces of the source/drain regions and selectively depositing an SiGe layer on the exposed surfaces by CVD.

The fourth example of the embodiment will be described by referring to FIG. 8. This device has a basic structure similar to that of FIG. 3.

In a MISFET, the SiGe buffer layer has a two-layered structure. More specifically, it comprises an SiGe buffer layer 113a formed by oxidation (with a Ge composition ratio of 55 atomic % and a thickness of 5 nm) and another SiGe buffer layer 113b (with a Ge composition ratio of 75 atomic % and a thickness of 10 nm) formed on the first SiGe buffer layer 113a. The strain of the Ge channel layer 114 of this MISFET is increased if compared with a MISFET having only a single SiGe buffer layer 113a due to the provision of the SiGe buffer layer 113b. Therefore, the Ge concentration of the SiGe buffer layer 113a of this MISFET can be held to a low level if compared with a MISFET having only a single SiGe buffer layer 113a. As a result, the operation of controlling the film thickness in the oxidation process can be conducted with a wide margin to improve the manufacturing yield.

Figure 8:
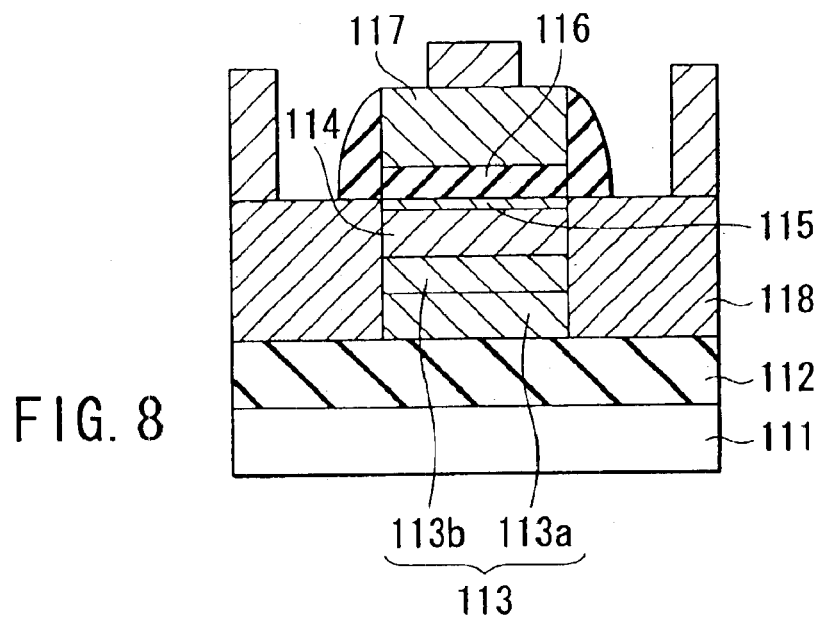
FIG. 8 is a schematic cross sectional view showing another structure of a semiconductor device according to the first embodiment of the invention.

The MISFET of FIG. 8 may be modified in such a way that the Ge concentration of the SiGe buffer layer 113b increases continuously or stepwise from the bottom toward the top.

Figure 9:
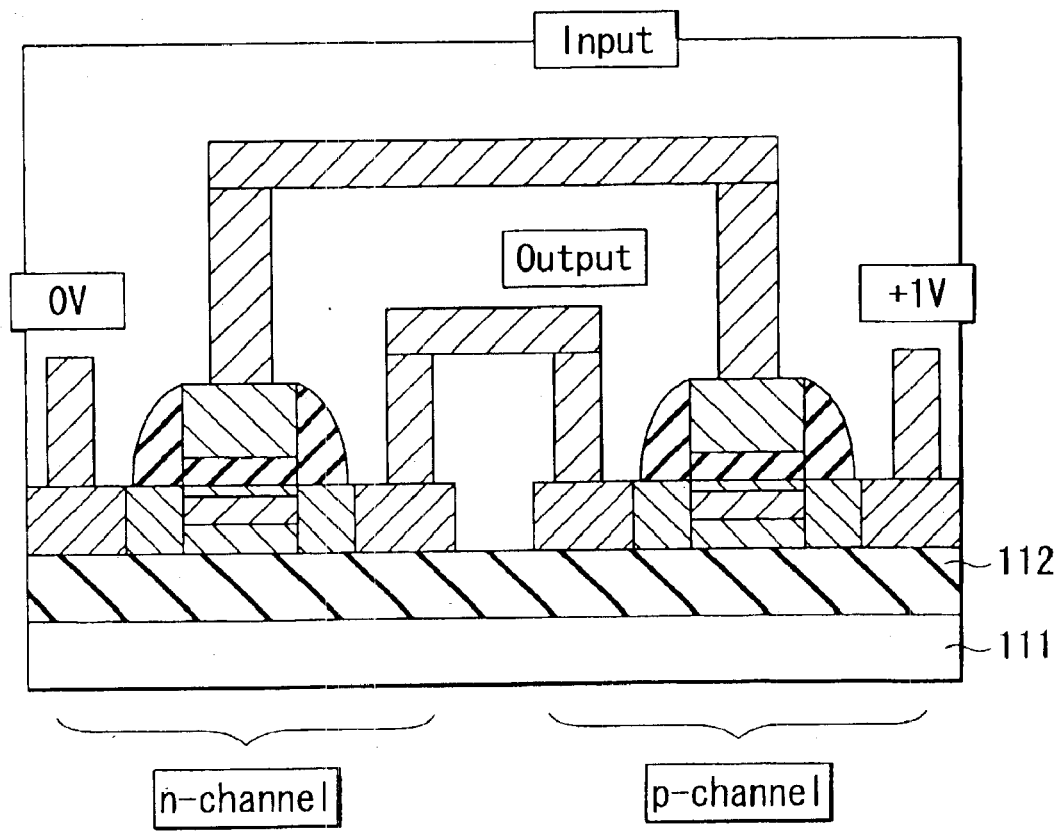
FIG. 9 is a schematic cross sectional view showing another structure of a semiconductor device according to the first embodiment of the invention.

The fifth example of the embodiment will be described by referring to FIG. 9.

This structure is realized by applying the MISFET (MOSFET) of FIG. 3 to a CMOS inverter. Referring to FIG. 9, the p-channel MOSFET and the n-channel MOSFET are insulated by a trench (not shown) that reaches the buried oxide film 112. The substrate 111 is biased so that it may operate as back gate for adjusting the threshold voltage.

(2nd Embodiment)

The second embodiment of the present invention will be described in term of manufacturing method adapted to obtain a SiGe buffer layer showing a high Ge concentration will be described by referring to FIGS. 10A through 10D.

Figure 10A:
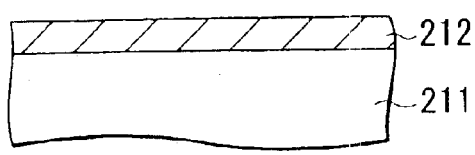
FIGS. 10A through 10D are schematic cross sectional views showing a manufacturing method of a substrate according to the second embodiment of the invention.

Firstly, a crystal silicon layer 212 containing oxygen by 7% is deposited on a single crystal silicon substrate 211 having a crystal surface with the (100) orientation. More specifically, the oxygen-containing crystal silicon layer 212 is formed in an ultra high vacuum CVD system (FIG. 10A). While such a system is described in detail in Japanese Patent Application No. 7-245236, it will be briefly described below.

A graphite heater for heating the silicon substrate held in a vacuum is set at a back side thereof. Thus, the silicon substrate can be heated by means of this heater to 1,000° C. An auxiliary heater is arranged at the front surface side of the substrate in order to thermally decompose gaseous molecules of source material. With the provision of the auxiliary heater, it is possible to supply decomposed source material to the front surface of the substrate under conditions where the substrate temperature is low and the source material is not decomposed on the front surface of the substrate. Therefore, the film growth can be accelerated at low temperature.

Specific film forming conditions for operating such a system include the following. The substrate temperature is 600° C. Disilane ($Si_2H_6$) gas is used for the source material for forming a silicon thin film. The partial pressure of the source gas is 20 mPa. Helium gas containing oxygen gas by 2% is introduced into the film forming atmosphere in order to dope oxygen atoms into the silicon thin film. The partial pressure of helium is 10 mPa and the partial pressure of oxygen is presumably 0.2 mPa. The temperature of the external heater at the front surface side of the substrate is 1,800° C. in operation. A 15 nm thick oxygen-containing crystal silicon layer 212 containing oxygen atoms by 7% in crystal silicon is obtained by conducting the film forming operation for 40 minutes under the above conditions. The oxygen-containing crystal silicon layer 212 was formed in a good-quality single crystalline structure sufficient to follow the lattice information of the underlying single crystal silicon substrate 211.

Figure 10B:
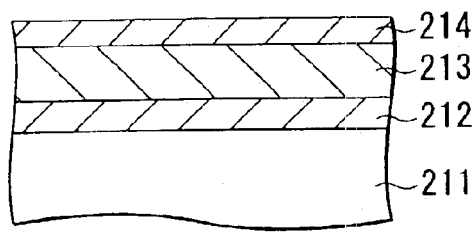

The supply of oxygen/helium mixture gas is stopped after the completion of forming the oxygen-containing crystal silicon layer 212. Then, germane ($GeH_4$) gas is introduced to grow a crystal SiGe layer under conditions including the following. The substrate temperature is 600° C. The partial pressure of disilane is 20 mPa. The partial pressure of germane is 45 mPa. A 100 nm thick crystal SiGe layer 213 with a Ge composition ratio of 20% (or a Ge concentration of 20 atomic %) is obtained by conducting the film forming process for 7 minutes. The obtained crystal SiGe layer 213 is in a strained state. The supply of germane gas is stopped after the completion of forming the crystal SiGe layer 213. Subsequently, a crystal silicon layer is made to grow under the film forming conditions of substrate temperature of 600° C. and disilane gas partial pressure of 8 mPa to obtain a 20 nm thick crystal silicon layer 214 (FIG. 10B).

With the above described process, an oxygen-containing crystal Si layer 212, a crystal SiGe layer 213 and a crystal Si layer 214 (Si cap layer) are sequentially and continuously formed on a single crystal silicon substrate 211 without being exposed to the air. In this stage, the lattice of the crystal SiGe layer 213 matches that of the underlying crystal Si layer 212 and the inside of the crystal SiGe layer 213 is strained.

The laminated substrate prepared in a manner as described above is then subjected to a thermal oxidation process in an oxidation furnace. The thermal oxidation process may be one that is used for manufacturing semiconductors. For this embodiment, the thermal oxidation process is conducted at 950° C. for 30 minutes. As a result of this process, the oxygen atoms in the oxygen-containing Si layer 212 are condensed to produce an amorphous silicon oxide layer formed of $SiO_2$ and SiO.

However, a flat amorphous silicon oxide layer is not necessarily produced under the above conditions of thermal oxidation. The flatness depends on the oxygen concentration and thickness of the oxygen-containing crystal Si layer before the thermal oxidation process. It is difficult to obtain a satisfactorily flat amorphous silicon oxide layer when the oxygen concentration is not greater than 10% and the heat treatment temperature is not higher than 1,100° C. Additionally, if the Si concentration of the oxygen-containing crystal silicon layer is low or if the heat treatment temperature is low, the amorphous silicon oxide layer is sometimes condensed in a spherical form, preventing a continuous film formation.

Figure 10C:
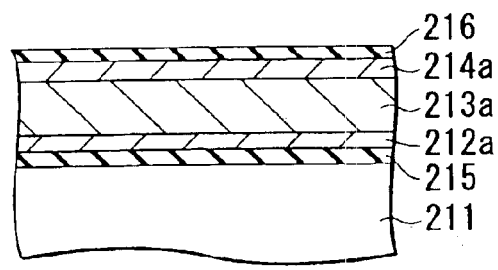

As a result of the above described thermal oxidation process, a laminate structure including an amorphous $SiO_x$ layer 215 (with an average thickness of 8 nm), a crystal Si layer 212a containing oxygen to a slight extent (with a thickness of 16 nm), a crystal SiGe layer 213a (with a thickness of 100 nm), a crystal Si layer 214a (with a thickness of 10 nm) and an $SiO_2$ layer 216 (with a thickness of 20 nm) is formed on the Si substrate 211 (FIG. 10C).

Thus, the crystal SiGe layer 213a is relaxed and the lattice constant of the crystal SiGe layer 213a is made to come close to that of proper SiGe by the heat treatment. On the other hand, the crystal Si layer 212a that contains oxygen to a slight extent and the crystal Si layer 214a at the front surface side are strained. It should be noted here that Ge is diffused into the crystal Si layer from the crystal SiGe layer so that the crystal Si layer contains Ge by 1 to several % as a result of the heat treatment.

Figure 10D:
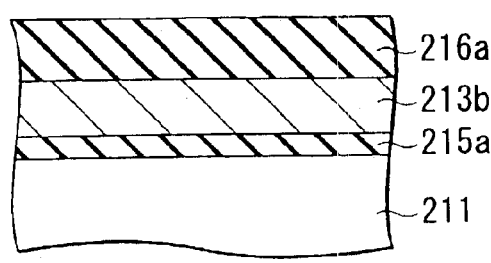

The substrate that is subjected to a thermal oxidation process is then annealed at high temperature in an oxidizing atmosphere containing oxygen at a high concentration level. More specifically, this second heat treatment is conducted at 1,280° C. for 15 minutes with a concentration ratio of oxygen gas to argon gas of 1:1. Preferably, the ratio of the oxygen gas (partial pressure ratio) in the atmosphere is not less than 10%. A 120 nm thick silicon oxide layer 216a is formed as a result of the heat treatment. Thus, a laminate structure including an $SiO_2$ layer (silicon oxide layer 215a with a thickness of 15 nm), a crystal SiGe layer 213b (with a Ge composition ratio of 22% and a thickness of 80 nm) and an $SiO_2$ layer 216 (silicon oxide layer with a thickness of 120 nm) is formed on the Si substrate 211 (FIG. 10D).

It should be noted here that not only the silicon oxide layer 216a at the front surface side but also the other silicon oxide layer 215a show an increased thickness. It may be safe to presume that oxygen is supplied from the front surface side to the silicon oxide layer 215a through the crystal SiGe layer 213a to promote the growth of the silicon oxide layer 215a. While the silicon oxide layers 215a and 216a show an increased thickness, the thickness of the crystal SiGe layer 213b is reduced. Furthermore, Ge atoms rarely remain in the silicon oxide layers 215a and 216a. As a result, the Ge concentration of the crystal SiGe layer 213a is raised.

It has been confirmed that the silicon oxide layer 215 that is poorly flat after the first heat treatment becomes highly flat as a result of the second high-temperature heat treatment. More specifically, the silicon oxide layer 215 formed in a spherical oxide form or in a discontinuous state is converted into an extremely flatten silicon oxide layer 215a by the second high-temperature thermal treatment.

It is possible to make the crystal SiGe layer thinner and raise the Ge concentration in the crystal SiGe layer by conducting the high temperature second heat treatment process for a prolonged period of time and increasing the film thickness of the silicon oxide layer 215a and that of the silicon oxide layer 216a. However, the SiGe layer can become degraded in the high temperature heat treatment process when the Ge concentration becomes too high. Then, additionally, Ge is segregated and melted out, or bumping takes place by an increase in vapor pressure. These problems can be effectively avoided by reducing the temperature of the heat treatment. Preferably, the heat treatment is conducted at temperature not higher than 1,250° C. when the Ge concentration ratio exceeds 25% and not higher than 1,230° C. when the Ge concentration ratio exceeds 30%. The temperature of the heat treatment may be lowered gradually in the process because the film thickness of the SiGe layer is reduced and the Ge concentration is increased in the course of the heat treatment.

The crystal quality of the crystal SiGe layer can be improved by conducting a third high temperature heat treatment with a reduced ratio of oxygen gas after the second heat treatment. While the crystal SiGe layer is relaxed normally by almost 100% at the end of the second heat treatment, the crystal quality may not be satisfactory when the duration of the second heat treatment is short. In the third heat treatment, the SiGe layer is heat-treated for about 4 hours in an argon gas atmosphere containing oxygen by not more than 1%, preferably by 0.2 to 0.8%, more preferably by 0.5%. It is possible to improve the crystal quality of the SiGe layer by this heat treatment.

The second heat treatment process is most important in the above described three heat treatment processes. The first heat treatment process may be omitted. The duration of the third heat treatment process may be curtailed or the process may be totally omitted if the ratio of oxygen gas is reduced to lower the rate of oxidation in the second heat treatment process and the duration of the second heat treatment process is prolonged.

Thus, it is possible to produce a thin SiGe buffer layer that shows a high Ge concentration and few defects such as dislocations and is satisfactorily relaxed, on a silicon oxide layer by the above described manufacturing method.

Note that the three step heat treatment process may be applied to other than laminate structures having an oxygen-containing crystal Si layer as underlayer. For example, it is possible to form a relaxed crystal SiGe layer that shows a high Ge concentration directly on a silicon oxide layer by forming a crystal SiGe layer and a crystal Si layer by epitaxial growth on an SOI substrate prepared by an ordinary method and subsequently heat-treating the layers.

Figure 11A:
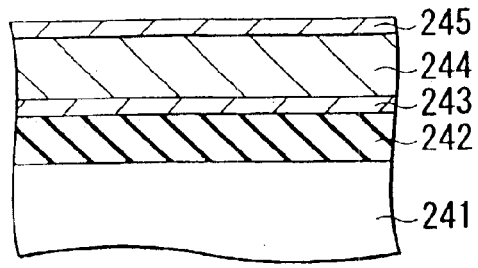
FIGS. 11A and 11B are schematic cross sectional views showing another manufacturing method of a substrate according to the second embodiment of the invention.
Figure 11B:
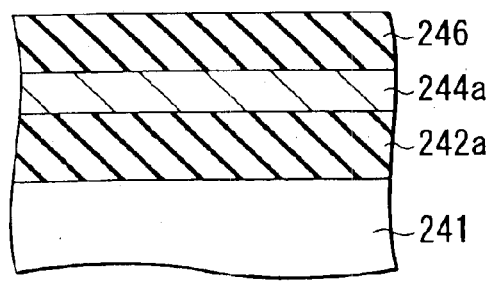

Now, a modified embodiment of manufacturing method will be described by referring to FIGS. 11A and 11B.

An SOI substrate comprising a silicon substrate 241, a silicon oxide layer 242 and a (10 nm thick) crystal Si layer 243 is brought in. Then, a (100 nm thick) crystal SiGe layer 244 showing a Ge composition ratio of 10% is formed on the SOI substrate and subsequently a (15 nm thick) crystal Si layer 245 is formed on the crystal SiGe layer 244. In this stage, the lattice of the crystal SiGe layer 244 matches that of the crystal Si layer 243 and the crystal SiGe layer is strained (FIG. 11A).

Then, the above layers are subjected to the above described first through third heat treatment processes. A silicon oxide film is formed at the front surface side as a result of the first heat treatment. Thereafter, both the film thickness of the silicon oxide layer 246 located at the front surface side and that of the inner silicon oxide layer 242a (buried oxide film) are increased by the high temperature second heat treatment process conducted in an oxidizing atmosphere. At this time, Ge atoms are diffused in the crystal region sandwiched by the silicon oxide layers 246 and 242a. Since Ge atoms are also diffused into the crystal Si layers 243 and 245, a crystal SiGe layer 244a is produced to show a substantially uniform composition. Additionally, the crystal SiGe layer 244a is relaxed as a result of the high temperature second heat treatment. Ge atoms are diffused satisfactorily into the crystal layer when the temperature and the duration of the high temperature second heat treatment are respectively not less than 1,050° C. and not less than an hour. Thereafter, a high quality crystal is produced as a result of the third heat treatment (FIG. 11B).

By this modified manufacturing method, again, it is possible to produce a thin SiGe buffer layer that shows a high Ge concentration and few defects such as dislocations and is satisfactorily relaxed, on a silicon oxide layer.

The three heat treatment processes of this embodiment can be applied to a SIMOX process. This will be described by referring to FIGS. 12A and 12B.

Figure 12A:
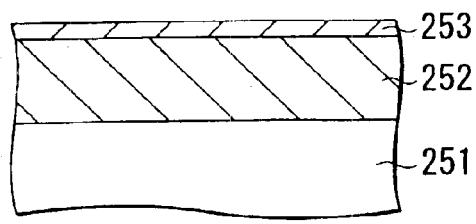
FIGS. 12A and 12B are schematic cross sectional views showing another manufacturing method of a substrate according to the second embodiment of the invention.

Firstly, a crystal SiGe layer 252 (with a Ge composition ratio of 15%) is formed to a thickness not less than 1 μm on a silicon substrate 251 and then a (20 nm thick) crystal Si layer 253 (Si cap layer) is formed on the crystal SiGe layer 252 (FIG. 12A).

Figure 12B:
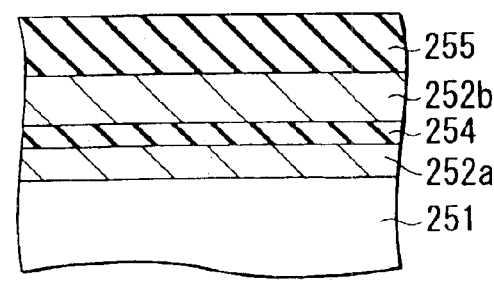

Then, oxygen ions are implanted into the crystal SiGe layer 252 and subsequently the layers are subjected to the above described first through third (or second and third) heat treatment processes. As a result of these heat treatment processes, a silicon oxide layer 254 is formed between the crystal SiGe layers 252a and 252b while a silicon oxide layer 255 is formed on the crystal SiGe layer 252b. The crystal SiGe layer 252b on the silicon oxide layer 254 is relaxed (FIG. 12B).

Specifically, this method comprises the following steps. Firstly, oxygen ions are implanted into the crystal SiGe layer formed on the Si substrate 251 to a doze of $4 \times 10^{17}/cm^2$ by applying an acceleration voltage of 160 keV. Subsequently, the first heat treatment process is carried out and thereafter the second heat treatment process is performed in an oxidizing atmosphere containing oxygen to a large extent. The silicon oxide layer 254 (buried oxide film) is produced and the film thickness of the silicon oxide layer 255 formed at the front surface side is increased as a result of the heat treatment. At the same time, the Ge concentration of the crystal SiGe layer 252b sandwiched between the silicon oxide layers 254 and 255 increases and the crystal SiGe layer 252b reduced in thickness.

In the case of SIMOX method, the region where oxygen ions are implanted does not become a completely vitrified silicon oxide layer just after implantation. Therefore, the region implanted with oxygen ions does not operate as barrier for preventing diffusion of Ge atoms. Therefore, although the SiGe layer is slightly thicker than that of the region doped with oxygen ions, this difference in thickness is not enough to prevent diffusion of Ge ions. Ge atoms are diffused in the beginning of the high temperature thermal treatment, with the result that the Ge concentration of the SiGe layer decreases. Therefore, to prevent the decrease in Ge concentration, it is necessary to increase the thickness of the SiGe layer sufficiently larger than that of the region doped with oxygen ions.

With this method, it is important to subject the SiGe layer sandwiched by the silicon oxide layers (or Si layers containing oxygen to a large extent) to a high temperature heat treatment process in an oxidizing atmosphere containing oxygen gas to a large extent. As a result of the high temperature heat treatment conducted in an oxidizing atmosphere, not only the surface region is oxidized but also oxygen atoms are moved to the inside of the crystal layer and grow the buried oxide film. As a result, a flat and high quality amorphous buried oxide film is obtained. Additionally, no Ge atoms are taken into the two silicon oxide layers and the vitrified silicon oxide layer operates as barrier that suppresses diffusion of Ge atoms. Then, the SiGe layer sandwiched by the two silicon oxide layers becomes thin and the Ge concentration of the layer is increased.

Techniques of directly implanting oxygen ions into an SiGe layer and producing a relaxed SiGe layer on a buried oxide film by means of the SIMOX method are known. However, in a case where the SiGe layer shows a high Ge concentration level, it is difficult with a known technique to appropriately select heating conditions for forming a high quality SiGe-OI (SiGe on insulator) layer. With the method of this embodiment, on the other hand, an SiGe layer showing a high Ge concentration can be realized with ease even when the Ge concentration of the SiGe layer is low because the Ge concentration is raised in the second high temperature heat treatment process.

Thus, by the above described manufacturing method, again, it is possible to produce a thin SiGe buffer layer that shows a high Ge concentration and few defects such as dislocations and is satisfactorily relaxed, on a silicon oxide layer.

The oxidizing atmosphere of the high temperature second heat treatment process of the embodiment may be not an atmosphere containing oxygen gas but an atmosphere containing steam ($H_2O$) to a large extent.

In the embodiment described above, the uppermost silicon oxide layers (silicon oxide layers 216a, 246, 255) may be removed by a hydrofluoric acid (HF) or ammonium fluoride solution to expose the SiGe layers (SiGe layers 213b, 244a, 252b). Additionally, an SiGe channel layer (or a Ge channel layer) showing a Ge concentration level higher than the SiGe buffer layer may be made to grown on the exposed SiGe layer (SiGe buffer layer) as in the first embodiment. Then, as a result, a laminate structure of (a strained SiGe channel layer/a relaxed SiGe buffer layer) can be formed on a silicon oxide film.

Now, a MISFET can be prepared by using the obtained substrate as in the first embodiment. Preferably, the Ge composition ratio of the SiGe buffer layer is not less than 30 atomic %.

Alternatively, a strained Si channel layer may be formed on the SiGe buffer layer obtained in a manner as described above. Then, it is also possible to prepare a MOSFET by using the strained Si channel layer. This technique will be discussed in detail below.

After forming a sufficiently relaxed thin SiGe buffer layer showing a high Ge concentration on a silicon oxide layer in a manner as described above, the uppermost silicon oxide layer is removed by a hydrofluoric acid solution (HF) or an ammonium fluoride solution. Subsequently, a strained single crystal Si layer is made to grown (to a thickness not greater than about 30 nm) on the exposed SiGe buffer layer.

Then, the surface of the strained single crystal Si layer is thermally oxidized to form a gate oxide film having a film thickness of about several nanometers. Preferably, this thermal oxidation process is conducted at temperature as low as possible. Specifically, it is preferably conducted at 850° C. or less. Ge atoms can be diffused from the SiGe buffer layer into the strained Si layer and/or the strained Si layer can become relaxed if the thermal oxidation temperature is high. When the thermal oxidation process is completed, a laminate structure having a strained Si layer and a gate oxide film formed on (a relaxed SiGe buffer layer/a buried oxide layer) is produced.

Thereafter, an about 50 nm thick polycrystalline Si layer is formed on the gate oxide film. Then, the polycrystalline Si layer is etched to produce the profile of a gate electrode. Subsequently, an extension region and gate side wall are formed. Thereafter, impurity ions are implanted to reduce the resistance of the polycrystalline Si layer and the source/drain regions. Preferably, the rapid thermal annealing operation following the ion implantation is conducted at about 850° C. If the annealing temperature is too high, the strained Si layer may be relaxed and/or the interface of the Si layer and the SiGe buffer layer may be degraded by the diffused Ge atoms.

Finally, an aluminum electrode is connected to the gate electrode and the source/drain regions to produce a complete MOSFET.

(3rd Embodiment)

Now, the third embodiment of the invention will be described. This embodiment is intended to prepare a vertical type MISFET by using a substrate obtained by the method described above for the first or second embodiment.

Figure 13:
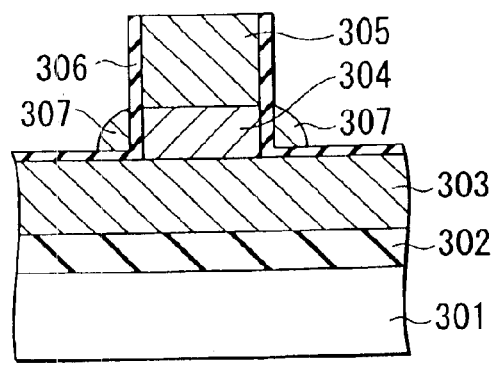
FIG. 13 is a schematic cross sectional view showing a structure of a semiconductor device according to the third embodiment of the invention.

FIG. 13 is a schematic cross sectional view of a principal part of a vertical MISFET of the third embodiment.

A buried silicon oxide film 302 is formed as insulating film on a single crystal silicon substrate 301 having the (100) orientation. A relaxed single crystal SiGe buffer layer 303 is formed on the silicon oxide film 302 and then a channel layer 304 of strained single crystal Ge is formed on the SiGe buffer layer 303. An SiGe cap layer 305 is formed on the channel layer 304. A gate insulating film 306 is formed on the side walls of the Ge channel layer 304 and other layers and a gate electrode 307 is formed on the side wall of the gate insulating films 306. The SiGe buffer layer 303 is used as either source or drain and the SiGe cap layer 305 is used as either drain or source, whichever appropriate. The Ge composition ratio of the SiGe buffer layer 303 is not less than 30 atomic %, preferably not less than 70 atomic %.

The Ge channel layer 304 may be replaced by a SiGe channel layer. If such is the case, the Ge composition ratio of the SiGe channel layer is made higher than the Ge composition ratio of the SiGe buffer layer 303.

The gate insulating film 306 may be made of a laminated film of Zr silicate/ZrO$_2$ as described earlier by referring to the first embodiment. The gate electrode 307 may be made of polycrystalline Si or polycrystalline SiGe that is doped with a p-type or n-type impurity as described earlier also by referring to the first embodiment.

Now, the method of manufacturing a vertical MISFET of this embodiment will be described by referring to FIGS. 14A through 14H.

Figure 14A:
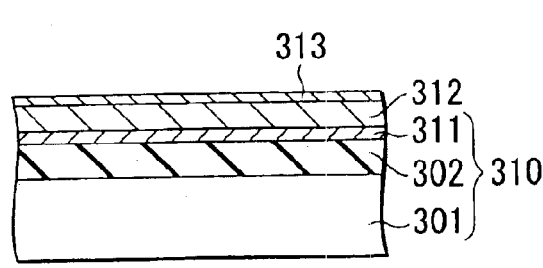
FIGS. 14A through 14H are schematic cross sectional views showing a manufacturing method of a semiconductor device according to the third embodiment of the invention.

Firstly, as shown in FIG. 14A, an SOI substrate 310 comprising an Si substrate 301, a buried oxide film 302 and an (about 20 nm thick) SOI film 311 is brought in. Then, an SiGe layer 312 and an Si cap layer 313 are formed on the SOI substrate 310. More specifically, an about 150 nm thick Si$_{0.9}$Ge$_{0.1}$ layer 312 and an about 5 nm thick Si cap layer 313 are sequentially formed by UHV-CVD, MBE or LP-CVD. No miss-fit dislocations occur since the film thickness of each of the layers is less than the critical film thickness at the growth temperature.

Figure 14B:
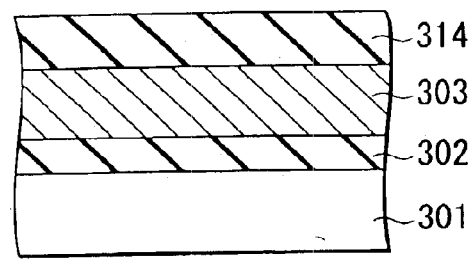

Then, as shown in FIG. 14B, a thermal oxidation film 314 and other related films are formed in an oxidation process in a manner as described below. Firstly, the substrate shown in FIG. 14A is put into an oxidation furnace. Then, the substrate is subjected to an oxidation process at about 1,000° C., using oxygen gas diluted to 50% by nitrogen, until the SiGe layer 303 shows a film thickness of 25 nm. While Ge can be sufficiently diffused in the SiGe layer 303 sandwiched by the buried oxide film 302 and the thermal oxidation film 314, Ge cannot be transmitted through the upper and lower oxide films. Therefore, as a result of the oxidation process, the thickness of the SiGe layer 303 is reduced and, at the same time, the Ge composition ratio is raised to about 70 atomic %.

Figure 14C:
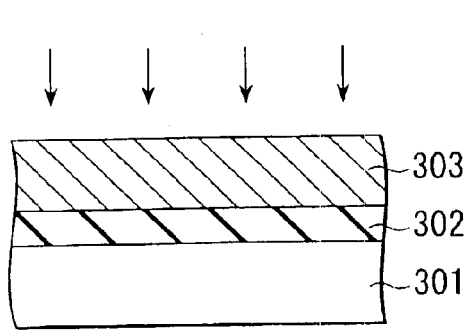

Then, as shown in FIG. 14C, the silicon oxide film 314 is removed. Thereafter, arsenic (As) ions are implanted to a dose of about 5×10$^{15}$/cm$^{-2}$. Then, the substrate is annealed to reduced the electric resistance of the layer implanted with ions.

Figure 14D:
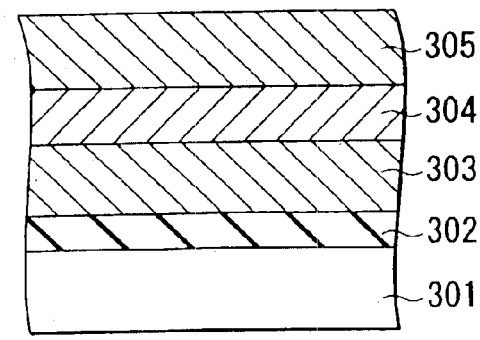

Then, as shown in FIG. 14D, a single crystal layer is formed. More specifically, after cleansing the surface, a 30 nm thick Ge channel layer 304 and a 100 nm thick Si$_{0.3}$Ge$_{0.7}$ layer 305 are epitaxially grown by UHV-CVD, MBE or LP-CVD. At this time, while the Si$_{0.3}$Ge$_{0.7}$ layer 305 is preferably doped with an n-type impurity to a high concentration level, the Si$_{0.3}$Ge$_{0.7}$ layer 305 may be doped again with an n-type impurity by ion implantation after the epitaxial growth.

Figure 14E:
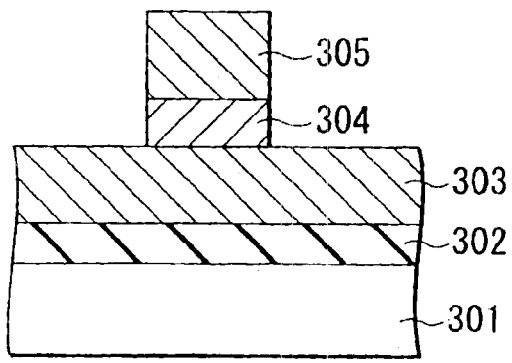

Thereafter, a patterning operation is conducted in a manner as described below by referring to FIG. 14E. Firstly, a photoresist pattern (not shown) is formed on the surface. Then, by using the photoresist pattern as a mask, the n-type Si$_{0.3}$Ge$_{0.7}$ layer 305 and the Ge channel layer 304 are etched by RIE to form an island. The resist pattern is removed after the etching process.

Figure 14F:
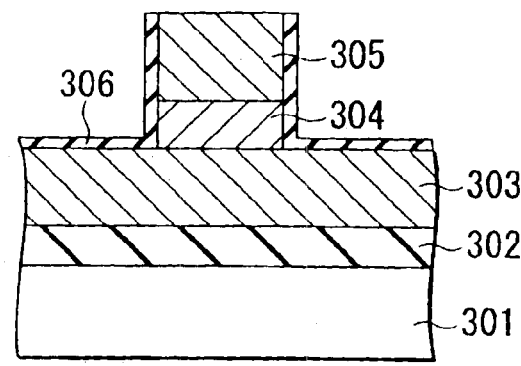

Then, as shown in FIG. 14F, an about 3 nm thin insulating film 306 is formed on the wafer surface by CVD. Part of the insulating film 306 becomes a gate insulating film.

Figure 14G:
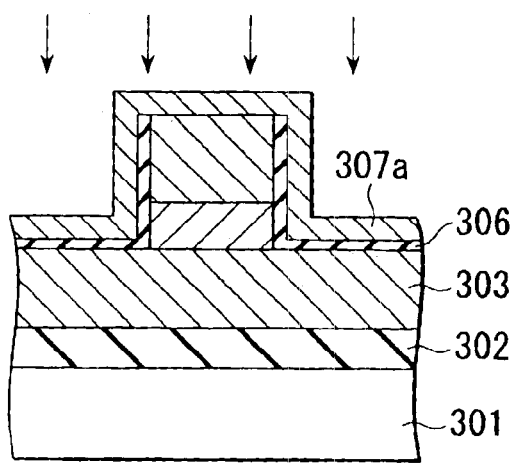
Figure 14H:
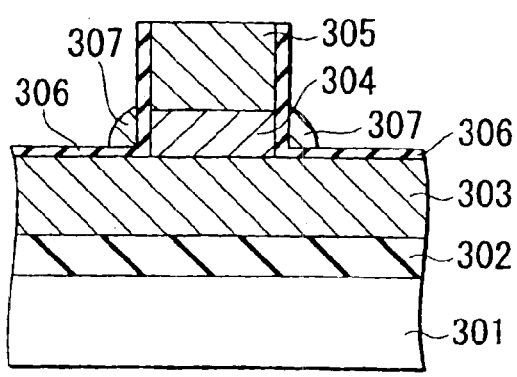

Subsequently, as shown in FIG. 14G, an about. 20 nm thick polycrystalline Si layer 307a is deposited on the entire surface of the wafer. Then, phosphor ions are implanted to a dose of about 5×10$^{15}$/cm$^{-2}$. Thereafter, the substrate is annealed to turn the polycrystalline Si layer 307a to an n-type polycrystalline Si layer showing a high impurity concentration.

Then, a gate electrode 307 is formed in a manner as shown in FIG. 14G. More specifically, the polycrystalline Si layer 307a is etched back by anisotropic etching. With this operation, a gate electrode 307 is formed out of the n-type polycrystalline Si layer 307a on the side walls of the island structure. The polycrystalline Si layer 307a on the island structure may be removed by polishing, using the technique of CMP before the etching back operation. Thereafter, the gate insulating film 306 is partly opened and upper and lower source/drain electrodes (not shown) are formed.

It will be appreciated that the basic structure as shown in FIG. 14B can be prepared by using any of the methods described earlier by referring to the first and second embodiments.

As described above, with this embodiment again, it is possible to provide a MISFET adapted to operate at high speed and showing satisfactory characteristics and a sufficient level of reliability by preparing a SiGe buffer layer similar to those described earlier by referring to the first and second embodiments and then forming a Ge channel layer (or an SiGe channel layer) thereon. Since this embodiment is a vertical MISFET, it can operate at higher speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a base substrate;
   a silicon oxide layer formed on the base substrate;
   a first semiconductor layer formed on the silicon oxide layer, the first semiconductor aver including a SiGe aver with a Ge concentration not less than 30 atomic %;

a second semiconductor layer formed on the first semiconductor layer, the second semiconductor layer including a Ge layer or a SiGe layer with a Ge concentration higher than the first semiconductor layer;

a gate electrode configured to induce a channel in a surface region of the second semiconductor layer; and a gate insulating film formed between the second semiconductor layer and the gate electrode, wherein the gate insulating film is formed on a side surface of the second semiconductor layer.

2. The semiconductor device according to claim 1, further comprising a third semiconductor layer formed on an upper surface of the second semiconductor layer, wherein the first semiconductor layer includes one of a source region and a drain region and the third semiconductor layer includes the other of the source region and the drain region.

3. A semiconductor device comprising:

a base substrate;

a silicon oxide layer formed on the base substrate;

a first semiconductor layer formed on the silicon oxide layer, the first semiconductor layer including a SiGe layer with a Ge concentration not less than 30 atomic %;

a second semiconductor layer formed on the first semiconductor layer, the second semiconductor layer including a Ge layer or a SiGe layer with a Ge concentration higher than the first semiconductor layer;

a gate electrode configured to induce a channel in a surface region of the second semiconductor layer; and a gate insulating film formed between the second semiconductor layer and the gate electrode, wherein a distribution of Ge atoms contained in the first semiconductor layer is uniform in a depth direction.

4. A semiconductor device comprising:

a base substrate;

a silicon oxide layer formed on the base substrate;

a first semiconductor layer formed on the silicon oxide layer, the first semiconductor layer including a SiGe layer with a Ge concentration not less than 30 atomic %;

a second semiconductor layer formed on the first semiconductor layer, the second semiconductor layer including a Ge layer or a SiGe aver with a Ge concentration higher than the first semiconductor layer;

a gate electrode configured to induce a channel in a surface region of the second semiconductor layer; and a gate insulating film formed between the second semiconductor layer and the gate electrode, wherein the first semiconductor layer has a first lattice constant in a first direction parallel to a main surface of the base substrate, the second semiconductor layer has a second lattice constant in the first direction, and wherein the first lattice constant is greater than a lattice constant of Si and equal to the second lattice constant.

5. A semiconductor device comprising:

a base substrate;

a silicon oxide layer formed on the base substrate;

a first semiconductor layer formed on the silicon oxide layer, the first semiconductor layer including a SiGe layer with a Ge concentration not less than 30 atomic %;

a second semiconductor aver formed on the first semiconductor layer, the second semiconductor layer including a Ge layer or a SiGe layer with a Ge concentration higher than the first semiconductor layer;

a gate electrode configured to induce a channel in a surface region of the second semiconductor layer; and a gate insulating film formed between the second semiconductor layer and the gate electrode, wherein the SiGe layer included in the first semiconductor layer has a Ge concentration not less than 60 atomic %.

6. A semiconductor device comprising:

a silicon oxide layer formed on the base substrate;

a first semiconductor layer formed on the silicon oxide layer, the first semiconductor layer including a SiGe layer with a Ge concentration not less than 30 atomic %;

a second semiconductor layer formed on the first semiconductor layer, the second semiconductor layer including a Ge layer or a SiGe layer with a Ge concentration higher than the first semiconductor layer;

a gate electrode configured to induce a channel in a surface region of the second semiconductor layer; and a gate insulating film formed between the second semiconductor layer and the gate electrode, wherein the first semiconductor layer includes a lower portion and an upper portion with a Ge concentration higher than the lower portion.

7. A semiconductor device comprising:

a base substrate;

a silicon oxide layer formed on the base substrate;

a first semiconductor layer formed on the silicon oxide layer, the first semiconductor layer including a SiGe layer with a Ge concentration not less than 30 atomic %;

a second semiconductor layer formed on the first semiconductor layer, the second semiconductor layer including a Ge layer or a SiGe layer with a Ge concentration higher than the first semiconductor layer;

a gate electrode configured to induce a channel in a surface region of the second semiconductor layer;

a gate insulating film formed between the second semiconductor layer and the gate electrode; and a Si layer formed between the second semiconductor layer and the gate insulating film, wherein the Si layer has a thickness not greater than 2 nm.

* * * * *

UNITED STATES PATENT AND TRADEMARK OFFICE
CERTIFICATE OF CORRECTION

PATENT NO. : 6,917,096 B2
DATED : July 12, 2005
INVENTOR(S) : Sugiyama et al.

It is certified that error appears in the above-identified patent and that said Letters Patent is hereby corrected as shown below:

Column 16,
Lines 66 and 67, change "aver" to -- layer --.

Column 17,
Line 46, change "aver" to -- layer --.

Column 18,
Line 9, change "aver" to -- layer --.

Signed and Sealed this

Twenty-seventh Day of September, 2005

JON W. DUDAS
*Director of the United States Patent and Trademark Office*